(12) United States Patent
Speer et al.

(10) Patent No.: US 9,287,467 B2
(45) Date of Patent: Mar. 15, 2016

(54) TECHNIQUES FOR ADHERING SURFACE MOUNT DEVICES TO A FLEXIBLE SUBSTRATE

(71) Applicants: Richard Speer, Concord, MA (US); Dave Hamby, Andover, MA (US); Adam Scotch, Amesbury, MA (US)

(72) Inventors: Richard Speer, Concord, MA (US); Dave Hamby, Andover, MA (US); Adam Scotch, Amesbury, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 14/273,054

(22) Filed: May 8, 2014

(65) Prior Publication Data

US 2015/0325755 A1 Nov. 12, 2015

(51) Int. Cl.
*H01L 23/34* (2006.01)
*H01L 33/48* (2010.01)
*H01L 33/62* (2010.01)
*H05K 1/02* (2006.01)
*H05K 1/11* (2006.01)
*H05K 1/03* (2006.01)

(52) U.S. Cl.
CPC .............. *H01L 33/486* (2013.01); *H01L 33/62* (2013.01); *H05K 1/028* (2013.01); *H05K 1/0326* (2013.01); *H05K 1/111* (2013.01); *H01L 2933/0033* (2013.01); *H01L 2933/0066* (2013.01); *H05K 2201/0145* (2013.01)

(58) Field of Classification Search
CPC ...... H01L 33/486; H01L 33/62; H05K 1/028; H05K 1/0326; H05K 1/111
USPC ..................................... 257/712, 99, E33.057
See application file for complete search history.

(56) References Cited

U.S. PATENT DOCUMENTS

| 2001/0055458 A1* | 12/2001 | Ladd .............................. 385/129 |
| 2014/0138733 A1* | 5/2014 | Hatano et al. ................... 257/99 |
| 2014/0239318 A1* | 8/2014 | Oyu ................................ 257/88 |

\* cited by examiner

*Primary Examiner* — Tu-Tu Ho
(74) *Attorney, Agent, or Firm* — Andrew Martin

(57) ABSTRACT

Techniques are disclosed for attaching SMDs to a flexible substrate using conductive epoxy bond pads. Each bond pad includes a set of elongated strips of conductive epoxy that are applied and cured onto the flexible substrate in an adjacent and parallel fashion. The bond pads are used to attach SMDs to the flexible substrate and also provide the conductive contacts for a printed circuit. A circuit may be printed on the flexible substrate using conductive ink that partially covers the bond pads, leaving a portion of the pads exposed. A second layer or strip of conductive epoxy may be applied over and across the exposed portions of the bond pad strips in order to attach an SMD. The number, size, and orientation of the epoxy bond pad strips may be determined by the amount of bending the flexible substrate is expected to withstand and/or the orientation of the bend.

19 Claims, 5 Drawing Sheets

TECHNIQUES FOR ADHERING SURFACE MOUNT DEVICES TO A FLEXIBLE SUBSTRATE

FIELD OF THE DISCLOSURE

This disclosure relates to circuit fabrication, and more specifically to attaching surface mount devices to flexible substrates.

BACKGROUND

In circuit fabrication, surface mount devices (SMDs) may be attached to a printed circuit board, and in some cases the circuit board may be a flexible circuit board. A flexible substrate, such as polyethylene terephthalate (PET), may be significantly cheaper than, for example, a rigid FR4 circuit board and can allow for efficient roll-to-roll manufacturing. Effectively attaching SMDs to flexible circuit boards, however, involves a number of non-trivial challenges.

DETAILED DESCRIPTION

Figure 1A:
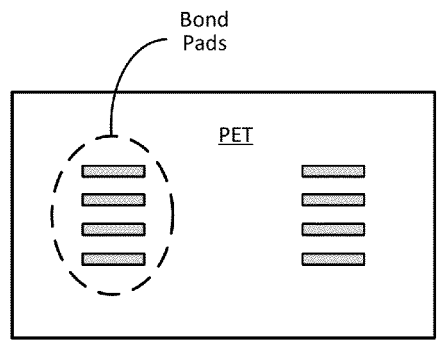
FIGS. 1a-d collectively illustrate attaching an LED package to a flexible substrate using conductive bond pads, according to an embodiment of the present invention.

Techniques are disclosed which allow for reliably attaching SMDs to a flexible substrate. Strips of conductive epoxy are applied to the flexible substrate and oriented to avoid cracking when the substrate is bent around a particular radius of curvature. Once cured, these epoxy strips will form conductive bond pads for attaching SMDs to the flexible substrate and will also provide the conductive contacts for a printed circuit. A circuit may be printed on the flexible substrate using conductive ink that partially covers the cured epoxy bond pad strips, leaving a portion of the pads exposed. After the ink has dried or cured, a second strip of conductive epoxy may be applied over the exposed portions of the earlier deposited bond pad strips in order to attach an SMD. This second strip is provided in a relatively perpendicular fashion with respect to the earlier deposited strips. The number, size, and orientation of the epoxy bond pad strips may be determined by the amount of bending the flexible substrate is expected to withstand and/or the orientation of the bend. For example, if the substrate will be bent around a small radius, the bending moment applied to the bond pad strips may be reduced by forming numerous thin bond pad strips for a single contact point and orienting the bond pad strips parallel to the bending axis (i.e. perpendicular to the radius of curvature).

The term perpendicular as used herein is not intended to imply a precise perpendicular or orthogonal relationship. Rather, the degree of perpendicular-ness may vary greatly from one embodiment to the next. For instance, in some embodiments, the perpendicular relationship between the initially deposited conductive bond pad strips to the later deposited conductive strip is such that the angle formed by the intersection of an initial strip with a later strip is in the range of 90° plus or minus 60°. So, in some cases, that angle is 90° plus or minus 5°, or plus or minus 10°, or plus or minus 15°, etc, up to plus or minus 60°. Likewise, while a strip as used herein generally refers to an elongated line of material, that line need not be perfectly straight and may include a degree of curvature (e.g., a sine wave shape or a triangle wave shape with a relatively low period, such as 1 cycle per 3 mm or 1 cycle per 5 mm, etc). Further note that the strip need not be regularly repeating or otherwise cyclical. Also, while the strips may be parallel to one another, a perfect parallel relationship is similarly not required (e.g., they may be substantially parallel such that if their respective lengths were extended in one direction to be triple that of their actual length, they would not intersect; alternatively, in other cases, they may be parallel in the sense that they don't actually intersect as deposited on the substrate but if their lengths were tripled in one direction they would intersect). In a more general sense, so long as the strips will provide reasonable contact reliability with respect to the bend forces associated with a given application is all that is necessary, in accordance with one embodiment. Numerous variations will be apparent in light of this disclosure.

General Overview

As previously explained, flexible substrates are used to fabricate flexible circuits. In some cases the circuits may be deposited on the flexible substrate using a silver ink, or other conductive ink, and various SMDs or chip-level devices may be attached to a flexible circuit board using low-temperature-cure electrically conductive adhesives. However, most commercially available epoxy-based conductive adhesives contain solvents that significantly reduce the adhesion properties of conductive inks used in printed circuit boards. For example, when using a conductive epoxy to attach an SMD to a silver ink trace printed on a PET substrate, the connection may fail before the conductive epoxy is cured because the epoxy may cause the silver trace to detach from the PET substrate. To avoid contact between the uncured epoxy and conductive inks, an SMD may be attached directly to a PET substrate using a conductive epoxy before the conductive ink is printed on the substrate. The epoxy footprint may extend beyond the footprint of the SMD, and once cured, the exposed epoxy will provide the contacts for the ink circuit to overlay. However, conductive epoxies used to attach electronic components generally become rigid after curing, and more flexible conductive adhesives may be unreliable due to their poor adhesion to flexible substrate materials, especially PET. If the surface area of the rigid cured epoxy is too large, the epoxy may crack when the flexible substrate is bent, resulting in circuit failure.

Thus, in accordance with an embodiment of the present invention, conductive bond pad strips are disclosed for attaching SMDs to a flexible substrate. For example, strips of conductive epoxy having strong bonding properties with PET may be applied to a flexible PET substrate and thermally or UV cured. These cured conductive epoxy strips will serve as the contacts for a printed circuit, as well as bond pads for placement of, for example, an LED package or other SMD. The strips are elongated, such that they are longer than they are wide (e.g., a length:width aspect ratio of at least 3:1, or 4:1, or 5:1, or higher). Because of the brittle nature of the cured epoxy, the dimensions and orientation of the bond pad strips are designed to resist cracking when the substrate is bent. In some embodiments, the number, size (including length and width, as well as height or thickness in the vertical direction), and/or orientation of the bond pad strips may be based on the radius of curvature the substrate is expected to withstand and/or the orientation of the expected bends. In other embodiments, two or more sets of bond pad strips may be deposited in different orientations in order to maximize circuit reliability if the substrate is bent along different axes.

In one example embodiment, conductive epoxy bond pads may be used to attach LED packages onto a flexible PET substrate as part of a roll-to-roll process for manufacturing a flexible LED circuit. In one example case, epoxy bond pads are applied to the PET substrate and designed to withstand being bent multiple times around a particular roll-radius used in the circuit manufacturing process. In one such embodiment, the bond pad strips are oriented perpendicular to the roll-radius, or perpendicular to the rolling direction, in order to reduce the bending moment applied to the individual bond pad strips. After application of the epoxy bond pads, the pads are thermally or UV cured in order to bond to the PET substrate. In some example embodiments, the Epo-Tek® H20E or Ablebond® 84-1LMI epoxies may be used as the bond pad epoxy, however, any other suitable conductive epoxy that provides strong adhesion to PET (or other flexible substrate material) may be used.

After curing the bond pads, a circuit pattern may be printed on the PET substrate using, for example, a conductive ink that does not exhibit cracking after it is dried or cured. The conductive ink covers a portion of at least one of the bond pads, and contacting more bond pads may result in greater circuit reliability, in some embodiments. The conductive ink leaves a portion of the bond pads exposed, allowing space for a second layer of conductive epoxy to attach the LED packages to the bond pads without the uncured second epoxy layer contacting the conductive ink. In one specific example, the individual surface areas of each bond pad are small enough to withstand various bending moments, while the combined surface area of the bond pads is large enough to effectively attach the LED package to the PET substrate and provide a contact for the conductive ink. In one embodiment, the second layer of conductive epoxy may be the same type of epoxy used to implement the bond pads; however, other epoxy types or solders may be used in other embodiments (for purposes of this disclosure, epoxy is used to refer to and include all such materials, including any solders). In one such embodiment, because the second layer of conductive epoxy is only needed to attach the LED packages to the bond pads, a more flexible epoxy that has strong bonding properties with the underlying bond pads but weaker bonding properties with PET may be used.

The dimensions of the conductive bond pads may also be determined, for example, based on the bending moments the flexible circuit is expected to withstand after circuit fabrication is completed. For example, a flexible LED circuit including an array of LED packages may be installed within a concave or corrugated housing that may bend the substrate in various directions and around various radii of curvature. In such an example embodiment, the size, number, and orientation of the bond pads may be determined based on the bending moments applied to the flexible circuit during commercial use, rather than during a roll-to-roll fabrication process.

As will be appreciated, the bond pads disclosed herein may be used for the attachment of various SMDs or chip-based devices onto a flexible substrate, including IC devices with multiple contact points. For ease of description, however, examples are provided with bond pads used for attaching LED packages to a flexible PET substrate where each set of conductive bond pads provides a contact point for the placement of the anode or cathode lead of the LED packages. After the epoxy bond pads are cured, the attachment of LED packages, printing of conductive ink traces, or any other circuit manufacturing processes may be performed in various orders, and the present disclosure is not intended to be limited to any particular manufacturing sequence. The circuit patterns, conductive ink, and/or epoxy may be deposited using various deposition techniques including ink jet printing, aerosol spraying, stamping, stencil printing, flexographic printing, gravure printing, rotogravure, pad printing, offset printing, and/or screen printing, just to name a few examples. Furthermore, and as will be appreciated, the present disclosure is not intended to be limited to roll-to-roll processing applications, and in some embodiments the epoxy bond pads may be deposited using flatbed printing techniques, as can the conductive ink traces and LED packages.

Conductive Bond Pad Examples

Figure 1B:
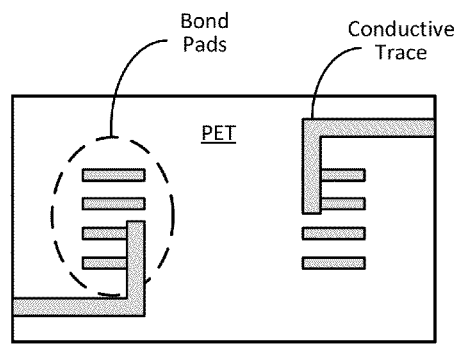

FIGS. 1a-d collectively illustrate the attachment of an SMD to a flexible substrate using epoxy bond pads, according to an embodiment of the present invention. As can be seen in FIG. 1a, two sets of four epoxy bond pads are applied to the flexible substrate to form two attachment points for an LED package. In this example, the flexible substrate is a PET substrate; however, any other suitable flexible substrate material may be used, in other embodiments. Once the bond pads have been applied to the PET, they may be thermally or UV cured and a conductive trace may be printed on the PET covering a portion of each set of bond pads, as shown in FIG. 1b. In one embodiment, the conductive trace is a printed silver ink used to print a circuit pattern over the PET substrate, and the silver ink must contact at least one of the bond pads and leave a portion of the contacted bond pads exposed. Application of the conductive ink may involve a drying, curing, or melting process, in some embodiments, in order to fully adhere to the PET substrate and cured bond pads. A portion of each of the bond pads constitutes a target area for the conductive trace to be printed over, and contacting more bond pads may provide greater circuit reliability. As can be seen in this example, each conductive trace contacts two of the bond pads within its target set of bond pads.

Figure 1C:
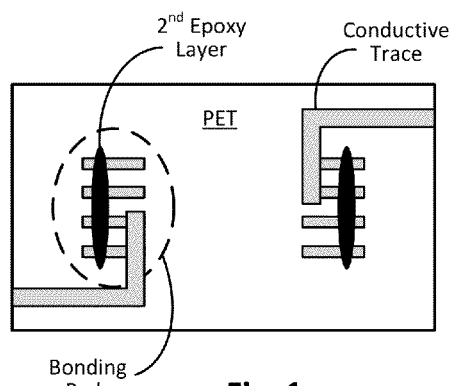
Figure 1D:
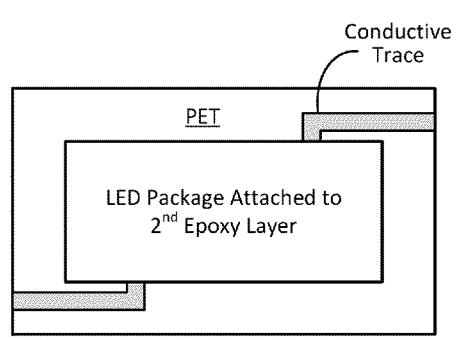

In one example embodiment, a second conductive epoxy layer may be applied over the exposed portions of the bond pads, as shown in FIG. 1c. As previously mentioned, the second layer of conductive epoxy may be the same type of epoxy used to implement the bond pads; however, other types of conductive epoxy may be used as long as they provide strong conductive adhesion between the LED package and the underlying bond pads. In this example, the second layer of epoxy includes two portions of epoxy, one for each set of bond pads, and the epoxy covers a portion of each bond pad. The second epoxy layer must contact the exposed portion of at least one bond pad contacting the conductive trace in order to provide an electrical connection between the conductive trace and LED package, and contacting a greater number of bond pads may improve circuit reliability. After the second conductive epoxy layer has been applied to the bond pads, the LED package or other SMD may be attached to the second epoxy layer, as shown in FIG. 1d. In such an example, once the second conductive epoxy layer has cured, the LED package is securely mounted to the PET substrate and electrically connected to the conductive trace via the conductive bond pads. Although this particular example shows four epoxy bond pads arranged parallel to the final orientation of the LED package, other embodiments may include fewer or more bond pads of varying sizes and orientations, depending on needs of each individual application. To this end, the length and width, as well as the height or thickness in the vertical direction of the bond pads can be varied to suit the bend forces of a particular application.

Figure 2A:
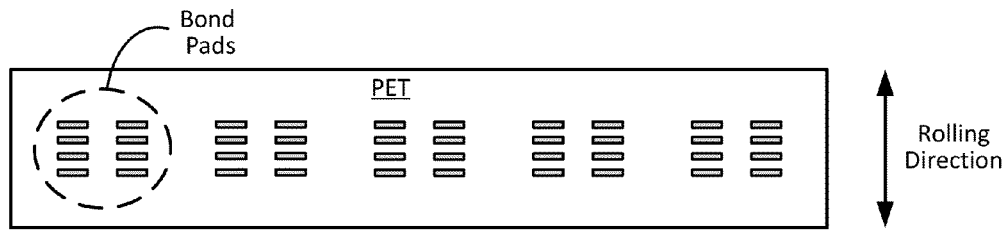
FIGS. 2a-c collectively illustrate the formation of a string of LEDs on a flexible substrate using conductive bond pads, according to an embodiment of the present invention.
Figure 2B:
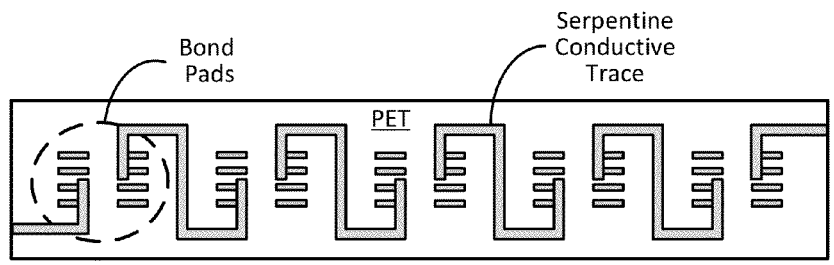
Figure 2B:
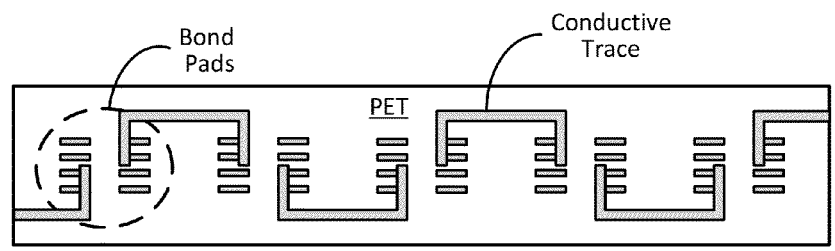
Figure 2C:
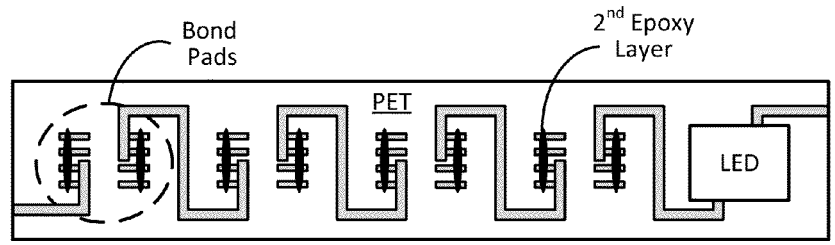

FIGS. 2a-c collectively illustrate the attachment of a string of LEDs onto a flexible substrate using conductive bond pads, according to an embodiment of the present invention. As can be seen in FIG. 2a, the flexible substrate is a strip of PET upon which multiple sets of conductive epoxy bond pads may be deposited and cured. In this particular example, ten sets of parallel bond pads are deposited for the attachment of five LED packages, with two sets of bond pads for each LED package, and the up and down rolling direction for a roll-to-roll process is shown. After the bond pads have been applied and cured, the conductive traces may be printed onto the PET substrate covering portions of each set of conductive bond pads, as shown in FIGS. 2b-b'. FIGS. 2b-b' illustrate two example conductive trace patterns, including a serpentine trace and a more direct trace pattern. In some embodiments, once the conductive trace has been printed and cured, a second layer of conductive epoxy may be deposited over the exposed portions of each set of bond pads, as shown in FIG. 2c. The location of an LED package can also be seen, in this example. The LED package attaches to the PET substrate via the second epoxy layer and the conductive bond pads, and the conductive trace connects to the LED package via the conductive bond pads. In this example, the footprint of the LED package covers the bond pads as well as the contact point for the conductive traces; however, other component layouts may be implemented and will be apparent in light of this disclosure. As discussed above, flexible circuits may be fabricated using roll-to-roll manufacturing processes with a rolling direction as shown in FIG. 2a, and in some embodiments the strip of PET substrate may be dispensed from a roll and may be re-rolled between each fabrication stage shown in FIGS. 2a, 2b-b', and 2c.

Figure 3A:
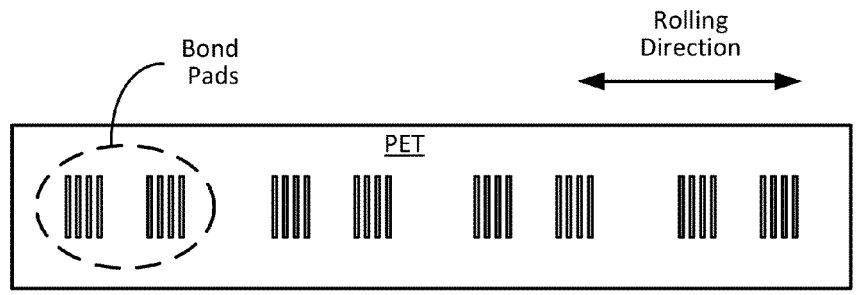
FIGS. 3a-c collectively illustrate the formation of a string of LEDs on a flexible substrate using conductive bond pads, according to another embodiment of the present invention.
Figure 3B:
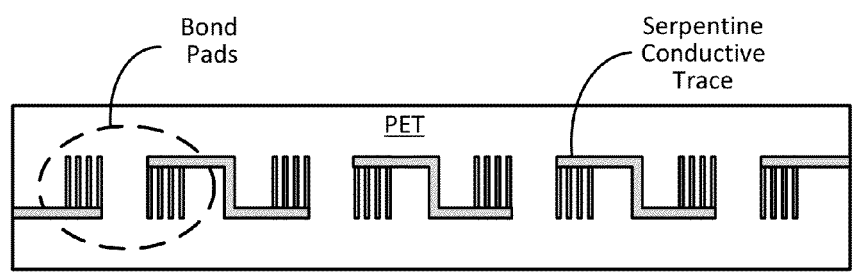
Figure 3B:
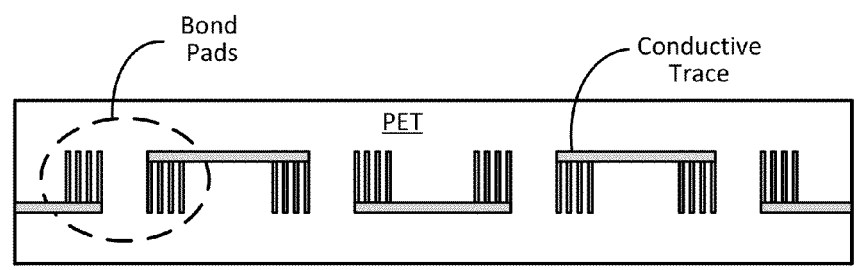
Figure 3C:
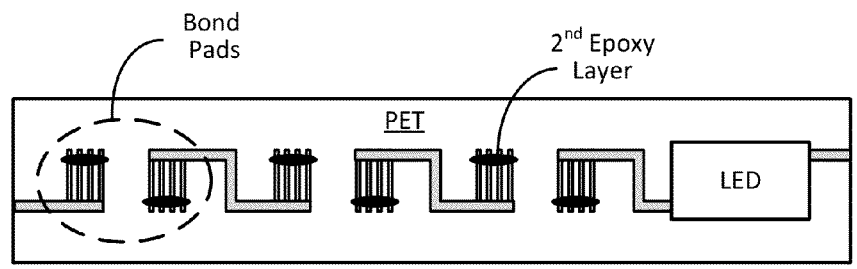

FIGS. 3a-c collectively illustrate the formation of a string of SMDs on a flexible substrate, according to another embodiment of the present invention. As can be seen in FIG. 3a, the flexible substrate is a strip of PET upon which multiple sets of conductive epoxy bond pads may be deposited and cured. In this particular example, eight sets of parallel bond pads are deposited for the attachment of four LED packages, with two sets of bond pads for each LED package, and a left and right rolling direction for a roll-to-roll process is shown. As can be seen, the bond pads in this example are oriented perpendicular to the orientation shown in FIGS. 2a-c. As discussed above, the size, number, and/or orientation of the bond pads may be determined based on a number of factors including the radius of curvature around which the substrate will be bent and the orientation in which the substrate will be bent. After the bond pads have been applied and cured, the conductive traces may be printed onto the PET substrate covering portions of each set of conductive bond pads, as shown in FIGS. 3b-b'. FIGS. 3b-b' illustrate two example conductive trace patterns, including a serpentine trace and a more direct trace pattern. In this particular example, the various conductive traces cover a portion of each conductive bond pad. In some embodiments, once the conductive trace has been printed and cured, a second layer of conductive epoxy may be deposited over the exposed portions of each set of bond pads, as shown in FIG. 3c. The location of an LED package can also be seen, in this example. The LED package attaches to the PET substrate via the second epoxy layer and the conductive bond pads, and the conductive trace connects to the LED package via the conductive bond pads. In this example, the footprint of the LED package covers the bond pads as well as the contact point for the conductive traces; however, other component layouts may be implemented in other embodiments and will be apparent in light of this disclosure. Similar to the example shown in FIGS. 2a-c, the flexible circuit in this example may be fabricated using roll-to-roll manufacturing processes, with a rolling direction as shown in FIG. 3a, and the PET substrate may be re-rolled between each fabrication stage shown in FIGS. 3a, 3b-b', and 3c. While FIGS. 2a-3c show examples of strings of LED packages connected in series, other arrangements of LED packages or SMDs may be fabricated according to the techniques disclosed herein.

Figure 4A:
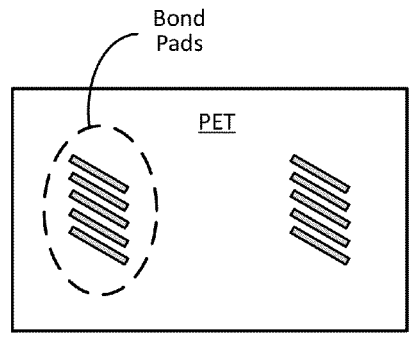
FIGS. 4a-b illustrate an example bond pad orientation for attaching an SMD to a flexible substrate, according to an embodiment of the present invention.
Figure 4B:
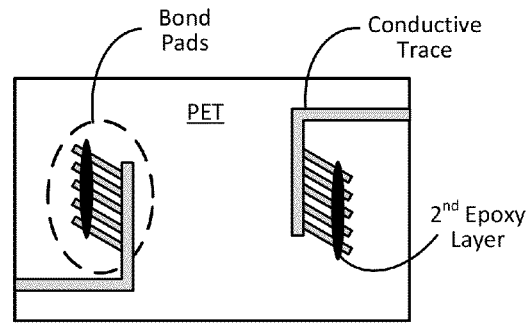

FIGS. 4a-b illustrate an example bond pad orientation for attaching an SMD to a flexible substrate, according to an embodiment of the present invention. FIG. 4a shows an example of two sets of five parallel bond pads on a PET substrate where the bond pads are oriented diagonally across the substrate. In some embodiments, such an orientation may reduce the bending moment applied to the bond pads when the substrate is bent in a particular direction. After the conductive bond pads have cured, the conductive traces and second layer of conductive epoxy may be applied over portions of the bond pads in order to attach an SMD, as described above and shown in FIG. 4b.

Figure 5A:
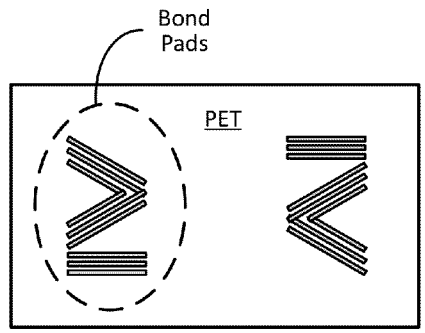
FIGS. 5a-b illustrate an example bond pad orientation for attaching an SMD to a flexible substrate, according to another embodiment of the present invention.
Figure 5B:
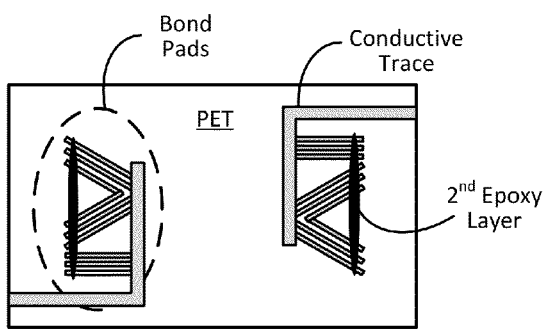

FIGS. 5a-b illustrate an example bond pad orientation for attaching an SMD to a flexible substrate, according to another embodiment of the present invention. FIG. 5a shows an example of two sets of bond pads on a PET substrate, where each set of bond pads includes three sub-sets of parallel bond pads, each having a different orientation. In this particular example, each set of bond pads includes three bond pad strips. In some embodiments, such an arrangement of bond pads may increase circuit reliability if the substrate is expected to bend along different axes. After the conductive bond pads have cured, the conductive traces and second conductive epoxy layer may be applied over portions of the bond pads in order to attach an SMD, as shown in FIG. 5b. As can be seen in this example embodiment, the conductive traces and second epoxy layer contact a portion of each sub-set of parallel bond pad strips in order to provide an electrical connection through each sub-set of conductive bond pads.

Figure 6A:
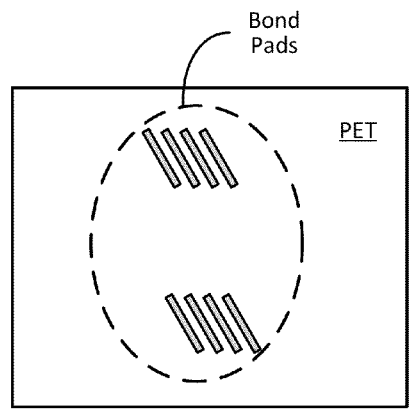
FIGS. 6a-b illustrate an example bond pad orientation for attaching an SMD to a flexible substrate, according to another embodiment of the present invention.
Figure 6B:
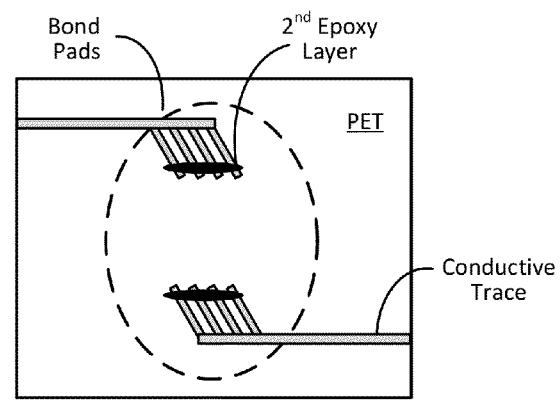

FIGS. 6a-b illustrate an example bond pad orientation for attaching an SMD to a flexible substrate, according to another embodiment of the present invention. FIG. 6a shows an example of two sets of five parallel bond pads on a PET substrate where the bond pads are oriented diagonally across the substrate. After the conductive bond pads have cured, the conductive traces and second conductive epoxy layer may be applied over portions of the bond pads, as shown in FIG. 6b. In this particular example, the second conductive epoxy layer is deposited on the interior portion of the bond pads such that after an SMD is attached to the bond pads, a portion of the bond pads may extend beyond the footprint of an SMD. In such an embodiment, the conductive traces may be printed after attachment of the SMDs because the portion of the bond pads extending beyond the footprint of the SMD can act as a contact point for the conductive traces. The bond pad arrangement in this example embodiment also allows for an SMD package to be attached perpendicular to the orientations shown in FIGS. 1a-3c. In some embodiments, such an orientation may help minimize the lengthwise bending moments applied to the flexible circuit, depending on the dimensions of the SMD.

Methodology

Figure 7:
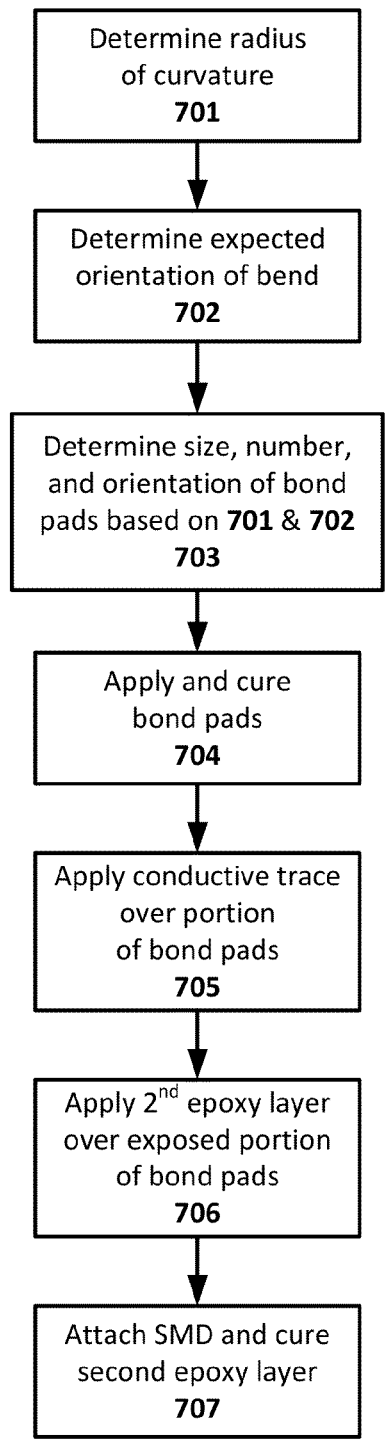
FIG. 7 illustrates a method for attaching an SMD to a flexible substrate using conductive bond pads, according to an embodiment of the present invention.

FIG. 7 illustrates a method for attaching an SMD to a flexible substrate using conductive bond pads, according to an embodiment of the present invention. The method may begin with determining 701 a radius of curvature that the flexible substrate is expected to withstand. In some embodiments, a flexible circuit may be manufactured using a roll-to-roll manufacturing process, and the radius of curvature is the particular roll-radius used in the manufacturing process. In other embodiments, a flexible circuit may be subject to various bending moments after fabrication, such as conforming to a corrugated or concave housing, and the radius of curvature is determined by the amount of bending the final circuit is expected to withstand. The method may continue with determining 702 the expected orientation in which the substrate will be bent. The method may continue with determining 703 the size, number, and/or orientation of the bonding pads based on the radius of curvature determined at 701 and/or the bend orientation determined in 702. For example, in an embodiment where the substrate will be bent around a small radius of curvature, a larger number of bond pads and/or thinner bond pads may be used compared to an embodiment where the substrate will be bent around a larger radius of curvature. In another example, orienting the bond pads perpendicular to the radius of curvature may decrease the bending moment applied to each of the bond pads. In other embodiments, two or more sets of bond pad strips may be deposited in different orientations in order to maximize circuit reliability if the substrate is bent along more than one axis. The method may continue with applying 704 and curing the conductive epoxy bond pads to the flexible substrate. The method may continue with applying 705 a conductive trace over a portion of the cured conductive bond pads. As discussed above, the conductive trace must contact at least one of the bond pads; however, a portion of the bond pads is left exposed for subsequent attachment of the SMD using a second layer of conductive epoxy. The conductive trace may be, for example, a printed silver ink, or some other suitable conductive ink used to print a circuit pattern and may require drying or curing after the printing process. The method may continue with applying 706 the second epoxy layer over an exposed portion of the bond pads. In some embodiments, the second layer of conductive epoxy may be the same type of epoxy used to implement the bond pads; however, other more flexible types of conductive epoxy may be used, in other embodiments, as long as they provide strong adhesion to the underlying bond pads. The method may continue with attaching 707 an SMD to the flexible substrate and curing the second conductive epoxy layer.

Numerous embodiments will be apparent, and features described herein can be combined in any number of configurations. One example embodiment provides a flexible circuit. The circuit includes a flexible substrate; a conductive contact pad formed on the substrate and configured to electrically couple to a corresponding contact of a surface mount device (SMD), the contact pad including a plurality of cured conductive epoxy bond pad strips deposited adjacent to one another in a parallel fashion; and at least one conductive trace deposited over the surface of the flexible substrate and contacting a portion of at least one of the plurality of cured conductive epoxy bond pad strips, leaving a portion of the at least one cured conductive epoxy bond pad exposed. In some cases, the flexible substrate is a PET substrate. In some cases, the size, number, and/or orientation of the plurality of cured conductive epoxy bond pad strips is determined based on the magnitude and/or orientation of a bending moment the flexible circuit is expected to withstand. In some cases, the size, number and/or orientation of the plurality of cured conductive epoxy bond pad strips is determined by the size and/or orientation of a roll-radius used in a roll-to-roll manufacturing process. In some cases, the circuit also includes an additional cured conductive epoxy bond strip deposited in a relatively perpendicular fashion across the plurality of cured conductive epoxy bond pad strips, wherein the additional cured conductive epoxy bond strip is for securing the SMD. In some such cases, the circuit further includes the SMD attached to the exposed portion of the at least one cured conductive epoxy bond pad strip via the additional cured conductive epoxy bond strip. In some such cases, the additional cured conductive epoxy bond strip is the same type of epoxy as the cured conductive epoxy bond pad strips. In other such cases, the cured conductive bond pad strips extend beyond a footprint of the SMD. In other such cases, the SMD is an LED package. In some such cases, the corresponding contact of the SMD is the anode or cathode of the LED package.

Another example embodiment provides a method of attaching a surface mount device (SMD) to a flexible substrate including depositing a plurality of elongated conductive epoxy strips onto a flexible substrate so that the conductive epoxy strips are proximate to one another in a parallel fashion. The method also includes curing the conductive epoxy strips, depositing a circuit pattern onto the flexible substrate, wherein the circuit pattern covers only a first portion of the cured conductive epoxy strips, depositing a second conductive epoxy strip over a second portion of the cured conductive epoxy strips in a relatively perpendicular fashion, attaching a corresponding contact of an SMD to the second portion of the cured conductive epoxy strips via the second conductive epoxy, and curing the second conductive epoxy. In some cases, the second conductive epoxy is the same type of epoxy as the conductive epoxy strips. In some cases, the first portion of the cured conductive epoxy strips extends beyond a footprint of the SMD. In some such cases, the circuit pattern is deposited after attaching the SMD and curing the second conductive epoxy. In some cases, the size, number, and/or orientation of the conductive epoxy strips is determined based on the magnitude and/or orientation of a bending moment the flexible substrate is expected to withstand. In some cases, depositing a plurality of elongated conductive epoxy strips onto a flexible substrate so that the conductive epoxy strips are proximate to one another in a parallel fashion is repeated to make a second set of the conductive epoxy strips to which another corresponding contact of the SMD can be electrically coupled.

Another embodiment provides a flexible circuit including a flexible substrate. The circuit also includes two conductive epoxy bond pads, one for each connection point of an LED package, wherein each bond pad includes a plurality of conductive epoxy bond pad strips cured onto a surface of the substrate. The circuit also includes a conductive ink circuit pattern printed onto the substrate contacting a portion of each conductive epoxy bond pad leaving a portion of each conductive bond pad exposed. The circuit also includes an LED package attached to the exposed portions of the two conductive epoxy bond pads via a second conductive epoxy strip that is relatively perpendicular to the conductive epoxy bond pad strips. In some cases, a footprint of the LED package completely covers the two conductive epoxy bond pads. In some cases, the second conductive epoxy strip is the same type of epoxy as the underlying bond pad strips. In some cases, at least two of the conductive epoxy bond pad strips within each conductive epoxy bond pad are substantially parallel to each other.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A flexible circuit comprising:
   a flexible substrate;
   a conductive contact pad formed on the substrate and configured to electrically couple to a corresponding contact of a surface mount device (SMD), the contact pad including a plurality of cured conductive epoxy bond pad strips deposited adjacent to one another in a parallel fashion; and
   at least one conductive trace deposited over the surface of the flexible substrate and contacting a portion of at least one of the plurality of cured conductive epoxy bond pad strips, leaving a portion of the at least one cured conductive epoxy bond pad exposed; further comprising an additional cured conductive epoxy bond strip deposited in a relatively perpendicular fashion across the plurality of cured conductive epoxy bond pad strips, wherein the additional cured conductive epoxy bond strip is for securing the SMD.

2. The circuit of claim 1 wherein the flexible substrate is a PET substrate.

3. The circuit of claim 1 wherein at least one of size, number, and orientation of the plurality of cured conductive epoxy bond pad strips is determined based on at least one of the magnitude and orientation of a bending moment the flexible circuit is expected to withstand.

4. The circuit of claim 1 wherein at least one of size, number and orientation of the plurality of cured conductive epoxy bond pad strips is determined by at least one of size and orientation of a roll-radius used in a roll-to-roll manufacturing process.

5. The circuit of claim 1 further comprising the SMD attached to the exposed portion of the at least one cured conductive epoxy bond pad strip via the additional cured conductive epoxy bond strip.

6. The circuit of claim 5 wherein the additional cured conductive epoxy bond strip is the same type of epoxy as the cured conductive epoxy bond pad strips.

7. The circuit of claim 5 wherein the cured conductive bond pad strips extend beyond a footprint of the SMD.

8. The circuit of claim 5 wherein the SMD is an LED package.

9. The circuit of claim 8 wherein the corresponding contact of the SMD is the anode or cathode of the LED package.

10. A method of attaching a surface mount device (SMD) to a flexible substrate comprising:
    depositing a plurality of elongated conductive epoxy strips onto a flexible substrate so that the conductive epoxy strips are proximate to one another in a parallel fashion;
    curing the conductive epoxy strips;
    depositing a circuit pattern onto the flexible substrate, wherein the circuit pattern covers only a first portion of the cured conductive epoxy strips;
    depositing a second conductive epoxy strip over a second portion of the cured conductive epoxy strips in a relatively perpendicular fashion;
    attaching a corresponding contact of an SMD to the second portion of the cured conductive epoxy strips via the second conductive epoxy; and
    curing the second conductive epoxy.

11. The method of claim 10 wherein the second conductive epoxy is the same type of epoxy as the conductive epoxy strips.

12. The method of claim 10 wherein the first portion of the cured conductive epoxy strips extends beyond a footprint of the SMD.

13. The method of claim 12 wherein the circuit pattern is deposited after attaching the SMD and curing the second conductive epoxy.

14. The method of claim 10 wherein at least one of the size, number, and orientation of the conductive epoxy strips is determined based on at least one of a magnitude and orientation of a bending moment the flexible substrate is expected to withstand.

15. The method of claim 10 wherein depositing a plurality of elongated conductive epoxy strips onto a flexible substrate so that the conductive epoxy strips are proximate to one another in a parallel fashion is repeated to make a second set of the conductive epoxy strips to which another corresponding contact of the SMD can be electrically coupled.

16. A flexible circuit comprising:
    a flexible substrate;
    two conductive epoxy bond pads, one for each connection point of an LED package, wherein each bond pad comprises a plurality of conductive epoxy bond pad strips cured onto a surface of the substrate;
    a conductive ink circuit pattern printed onto the substrate contacting a portion of each conductive epoxy bond pad leaving a portion of each conductive bond pad exposed; and
    an LED package attached to the exposed portions of the two conductive epoxy bond pads via a second conductive epoxy strip that is relatively perpendicular to the conductive epoxy bond pad strips.

17. The circuit of claim 16 wherein a footprint of the LED package completely covers the two conductive epoxy bond pads.

18. The circuit claim 16 wherein the second conductive epoxy strip is the same type of epoxy as the underlying bond pad strips.

19. The circuit of claim 16 wherein at least two of the conductive epoxy bond pad strips within each conductive epoxy bond pad are substantially parallel to each other.

* * * * *